United States Patent
Howe et al.

(10) Patent No.: US 7,514,853 B1
(45) Date of Patent: Apr. 7, 2009

(54) MEMS STRUCTURE HAVING A STRESS INVERTER TEMPERATURE-COMPENSATED RESONATING MEMBER

(75) Inventors: Roger T. Howe, Los Gatos, CA (US); Emmanuel P. Quevy, El Cerrito, CA (US); David H. Bernstein, Oakland, CA (US)

(73) Assignee: Silicon Clocks, Inc., Fremont, CA (US)

( * ) Notice: Subject to any disclaimer, the term of this patent is extended or adjusted under 35 U.S.C. 154(b) by 0 days.

(21) Appl. No.: 11/801,774

(22) Filed: May 10, 2007

(51) Int. Cl.
*H01L 23/34* (2006.01)

(52) U.S. Cl. ............... 310/346; 310/328; 310/315; 310/338

(58) Field of Classification Search ........... 310/346, 310/341, 315
See application file for complete search history.

(56) References Cited

U.S. PATENT DOCUMENTS 6,739,190 B2 * 5/2004 Hsu et al. ............... 73/497

7,211,926 B2   5/2007 Quevy et al.

OTHER PUBLICATIONS

Quevy, Emmanuel P., et al., "Redundant MEMS Resonators for Precise Reference Oscillators," (invited), IEEE Radio Frequency Integrated Circuits Symposium, Jun. 12-14, 2005, pp. 113-116, Long Beach, California.

Guckel, H., et al., "Diagnostic Microstructures for the Measurement of Intrinsic Strain in Thin Films," J. Micromech. Microeng., 2 (1992), pp. 86-95, United Kingdom.

* cited by examiner

*Primary Examiner*—Thomas M Dougherty
*Assistant Examiner*—Bryan P Gordon
(74) *Attorney, Agent, or Firm*—Blakely, Sokoloff, Taylor & Zafman (57) ABSTRACT

A MEMS structure having a temperature-compensated resonating member is described. The MEMS structure comprises a stress inverter member coupled with a substrate. A resonating member is housed in the stress inverter member and is suspended above the substrate. The MEMS stress inverter member is used to alter the thermal coefficient of frequency of the resonating member by inducing a stress on the resonating member in response to a change in temperature.

45 Claims, 10 Drawing Sheets

FIG. 1A

INCREASING TEMPERATURE

MEMS STRUCTURE HAVING A STRESS INVERTER TEMPERATURE-COMPENSATED RESONATING MEMBER

BACKGROUND OF THE INVENTION

1) Field of the Invention

The invention is in the field of Microelectromechanical Systems (MEMS).

2) Description of Related Art

For the past several years, MEMS structures have been playing an increasingly important role in consumer products. For example, MEMS devices, such as sensors, detectors and mirrors, can be found in products ranging from air-bag triggers in vehicles to displays in the visual arts industry. As these technologies mature, the demands on precision and functionality of the MEMS structures have escalated. For example, optimal performance may depend on the ability to fine-tune the characteristics of various components of these MEMS structures. Furthermore, consistency requirements for the performance of MEMS devices (both intra-device and device-to-device) often dictate that the processes used to fabricate such MEMS devices need to be extremely sophisticated.

Figure 1A:
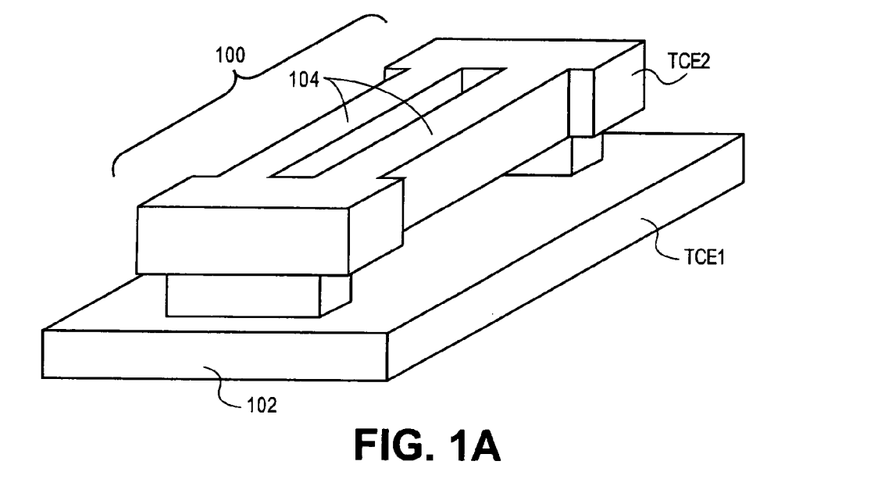
FIGS. 1A-B illustrate angled views representing a MEMS structure having a non-compensated resonating member responding to an increase in temperature, in accordance with the prior art.
Figure 1B:
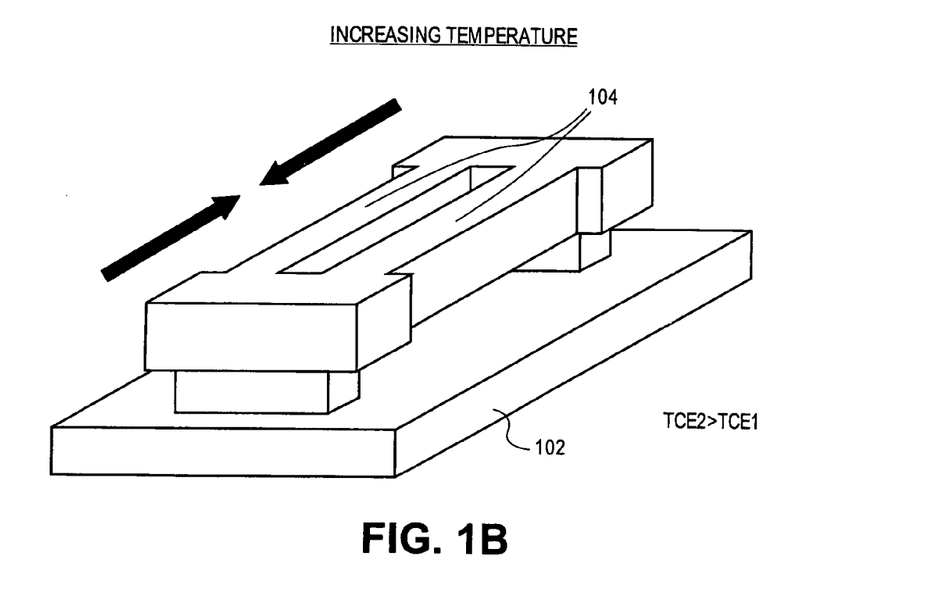

MEMS resonators are also becoming more prevalent. For example, a clocking device for an integrated circuit (IC) may be based on a MEMS resonator. However, if not compensated, the resonance frequency of the resonating member in such a MEMS structure may vary with temperature. Thus, a MEMS resonator may be unable to meet the specifications for frequency stability over the range of ambient temperatures needed for a particular application or may be unreliable for use in devices that generate varying levels of heat during operation. FIGS. 1A-B illustrate angled views representing a MEMS structure having a non-compensated resonating member responding to an increase in temperature, in accordance with the prior art.

Referring to FIG. 1A, a MEMS structure 100 comprises a resonating member 104 attached to a substrate 102. Substrate 102 is comprised of a material having a first thermal coefficient of expansion (TCE1) and MEMS structure 100 is comprised of a material having a second thermal coefficient of expansion (TCE2), where TCE2 is greater than TCE1. The material of MEMS structure 100 and, hence, resonating member 104 also has a negative thermal coefficient of frequency (TCf). That is, the resonance frequency of resonating member 104 decreases in response to an increase in temperature. As depicted by the arrows in FIG. 1B, the TCE mismatch (TCE2>TCE1) results in a compressive stress induced on resonating member 104 in response to an increase in temperature. That is, substrate 102 effectively constrains the expansion of resonating member 104. This compressive stress may exacerbate the already decreasing frequency tendency of resonating member 104 from the negative TCf.

Temperature-compensated resonating members have been fabricated by using multiple materials with differing physical characteristics. For example, silicon dioxide has been used to control the TCf of poly-SiGe resonators. However, the incorporation of additional materials into a resonating member may impact the high-Q and the high stability normally associated with the single material counterparts.

Thus, a MEMS structure having a stress inverter temperature-compensated resonating member is described herein.

DETAILED DESCRIPTION

A MEMS structure having a stress inverter temperature-compensated resonating member and a method to form such a structure are described. In the following description, numerous specific details are set forth, such as material compositions and chemical regimes, in order to provide a thorough understanding of the present invention. It will be apparent to one skilled in the art that the present invention may be practiced without these specific details. In other instances, well-known features, such as lithographic parameters and patterning procedures, are not described in detail in order to not unnecessarily obscure the present invention. Furthermore, it is to be understood that the various embodiments shown in the figures are illustrative representations and are not necessarily drawn to scale.

Disclosed herein is a MEMS structure having a temperature-compensated resonating member. The MEMS structure may comprise a stress inverter member coupled with a substrate. In an embodiment, a resonating member is housed in the stress inverter member and is suspended above the substrate. In one embodiment, the MEMS stress inverter member is used to alter the TCf of the resonating member by inducing a stress on the resonating member in response to a change in temperature. The stress inverter member may be coupled with the substrate via a pair of decoupling members. In an embodiment, the pair of decoupling members is provided to reduce the magnitude of the stress induced on the resonating member. In one embodiment, an array of n rows and m columns of stress inverter members connected to pairs of decoupling members is provided.

A MEMS structure having a stress inverter temperature-compensated resonating member may enhance the performance and reliability of a MEMS clocking device that incorporates such a MEMS structure. For example, in accordance with an embodiment of the present invention, a MEMS resonator is comprised of a resonating member having a resonance frequency that changes in correlation with a change in temperature, i.e. it has a non-zero thermal coefficient of frequency (TCf). The non-zero TCf results from a combination of material properties and residual stress from fabrication, but is exacerbated by stress caused from thermal coefficient of expansion (TCE) mismatch between the MEMS structure and a coupled substrate. Thus, in an embodiment, a stress inverter member is used to house the resonating member and to invert the type of stress experienced by the resonating member due to TCE mismatch. In one embodiment, the inverted stress is used to reduce the magnitude of the TCf of the resonating member. In a specific embodiment, the magnitude of the inverted stress is selected to substantially counter the TCf of the resonating member in order to substantially fix the resonance frequency over a selected temperature range. In a particular embodiment, the resonating member has a negative TCf and the stress inverter member has a TCE greater than the TCE of the substrate. Thus, the stress inverter member experiences a compressive stress in response to an increase in temperature. The stress inverter converts the compressive stress into a tensile stress induced on the resonating member to counter the negative TCf of the resonating member.

Figure 2:
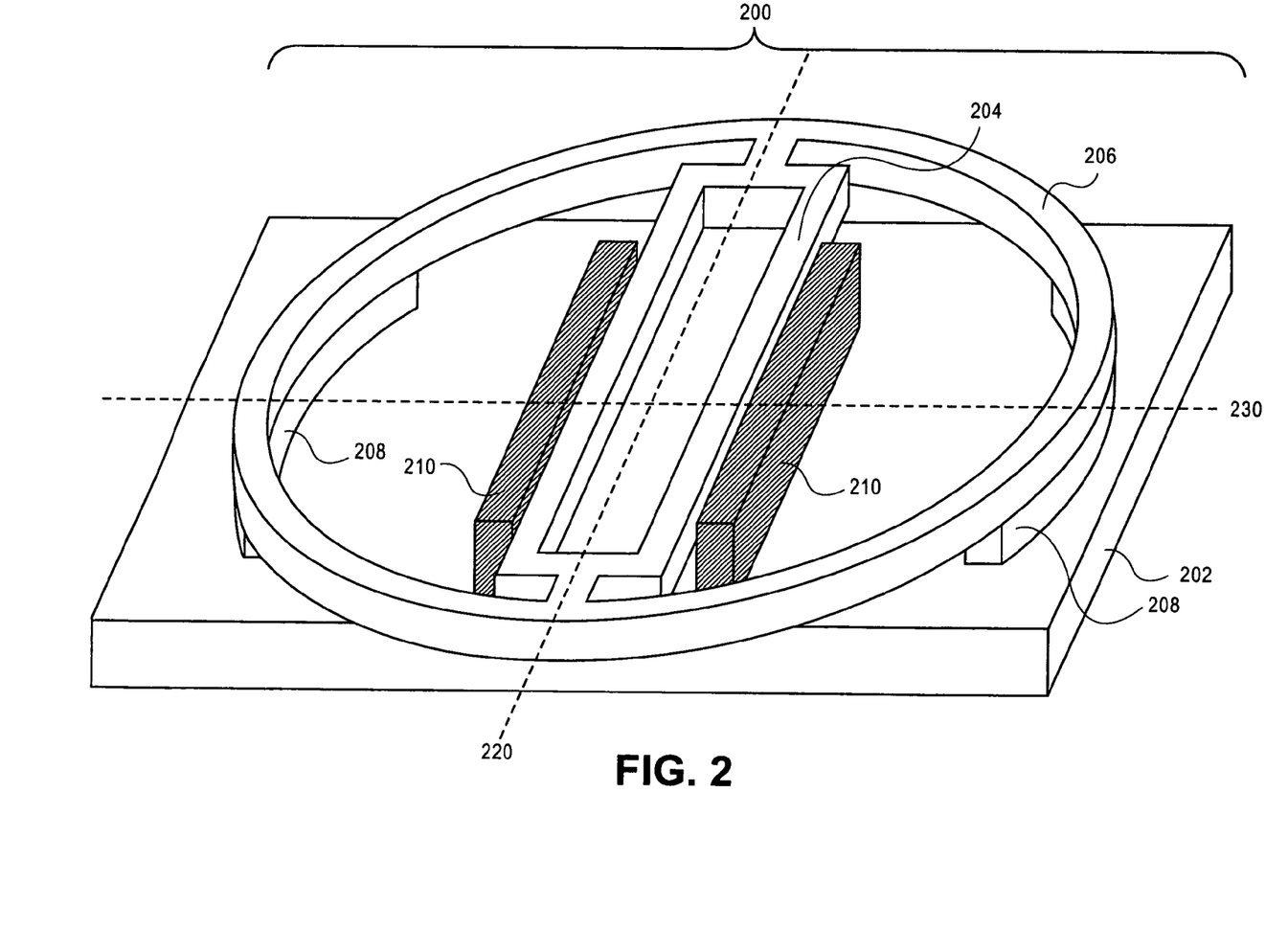
FIG. 2 illustrates an angled view representing a MEMS structure having a stress inverter temperature-compensated resonating member, in accordance with an embodiment of the present invention.

A MEMS structure may be fabricated having a resonating member housed in a stress inverter member. FIG. 2 illustrates an angled view representing a MEMS structure having a stress inverter temperature-compensated resonating member, in accordance with an embodiment of the present invention. Referring to FIG. 2, a MEMS structure 200 is formed on a substrate 202. MEMS structure 200 is comprised of a resonating member 204 suspended above substrate 202 and housed in a stress inverter member 206. Stress inverter member 206 is coupled with substrate 202 via anchors 208. A pair of electrodes 210 is coupled with substrate 202 on either side of resonating member 204.

MEMS structure 200 may be any device that falls within the scope of MEMS technologies. For example, MEMS structure 200 may be any mechanical and electronic structure having a critical dimension of less than approximately 250 microns and fabricated using lithography, deposition, and etching processes above a substrate. In accordance with an embodiment of the present invention, MEMS structure 200 is a device selected from the group consisting of a clock, a sensor, a detector and a mirror. In one embodiment, MEMS structure 200 is a clocking device based on the resonance frequency of resonating member 204.

Thus, resonating member 204 of MEMS structure 200 may be any suspended feature having a mode whose resonance frequency is a function of applied stress. For example, in an embodiment, resonating member 204 is attached to stress inverter member 206 at two opposing points which form axis 220 parallel to the longest dimension of resonating member 204, as depicted in FIG. 2. In a specific embodiment, resonating member 204 is a double-ended tuning fork, i.e. a resonating member comprised of two parallel beams, as is also depicted in FIG. 2. Resonating member 204 may have any dimensions suitable for a desired MEMS function. For example, in accordance with an embodiment of the present invention, MEMS structure 200 is a resonator comprised of a tuning fork resonating member 204. In one embodiment, the length of each beam of resonating member 204 is in the range of 1-250 microns, the thickness of each beam of resonating member 204 is in the range of 0.1-10 microns, the width of each beam of resonating member 204 is in the range of 0.1-100 microns and the relative lateral separation between the two parallel beams is in the range of 0.01-1 times the length of the beams. In a specific embodiment, the length of each beam of resonating member 204 is in the range of 70-90 microns, the thickness of each beam of resonating member 204 is in the range of 0.5-5 microns, the width of each beam of resonating member 204 is in the range of 0.5-5 microns and the distance between the two parallel beams is in the range of 0.5-25 microns. In an embodiment, resonating member 204 is suspended at a distance in the range of 0.1-5 microns above substrate 202.

Stress inverter member 206 may be any structure that can accommodate a stress applied to one region of stress inverter member 206 by altering the shape and positioning of another region of stress inverter member 206. For example, in accordance with an embodiment of the present invention, stress inverter member 206 is anchored to substrate 202 via anchors 208 at two opposing points which form axis 230. In a specific embodiment, axis 230 is orthogonal to axis 220, as depicted in FIG. 2. Thus, a stress applied along axis 230, e.g. a stress from the TCE mismatch with substrate 202, may be accommodated by deforming stress inverter member 206 along axis 220. In one embodiment, stress inverter member 206 is a ring as depicted in FIG. 2. Stress inverter member 206 may have any dimensions suitable to accommodate resonating member 204. In one embodiment, the thickness of stress inverter member 206 is substantially the same as the thickness of resonating member 204, stress inverter member 206 is suspended at substantially the same distance above substrate 202 as resonating member 204 and the width of stress inverter member 206 is in the range of 0.1-25 microns.

Stress inverter member 206 and, hence, resonating member 204 and anchors 208 may be formed from any material suitable for MEMS fabrication. For example, in accordance with an embodiment of the present invention, stress inverter 206 is comprised of a material selected from the group consisting of a semiconductor, an insulator and a conductor. In one embodiment, stress inverter 206 is comprised of a semiconductor material selected from the group consisting of silicon, germanium, diamond, silicon-germanium, carbon-doped silicon, carbon-doped silicon-germanium and a III-V material. In a specific embodiment, stress inverter member 206 is comprised of a material selected from the group consisting of amorphous silicon and polycrystalline silicon-germanium. The semiconductor material may also be comprised of dopant impurity atoms. For example, in a specific embodiment, stress inverter member 206 is comprised of polycrystalline silicon-germanium with a germanium atomic concentration in the range of 50-70% and boron dopant impurity atoms with a total atomic concentration in the range of $1\times10^{18}$-$5\times10^{20}$ atoms/cm$^3$. In one embodiment, stress inverter member 206 is comprised of an insulator material selected from the group consisting of silicon dioxide, silicon nitride, silicon oxy-nitride and a high-k dielectric material. In another embodiment, stress inverter member 206 is comprised of a conductor material selected from the group consisting of copper, aluminum, a metal alloy and a metal silicide. In a particular embodiment, stress inverter member 206, resonating member 204 and anchors 208 are all comprised of substantially the same material.

Stress inverter member 206 and, hence, resonating member 204 and anchors 208 may be formed by any process suitable to provide a MEMS structure having a feature suspended above a substrate. For example, in accordance with an embodiment of the present invention, stress inverter member 206, resonating member 204 and anchors 208 are formed using a combination of structural and release layers by a process selected from the group consisting of a subtractive etch process, a single damascene process, a dual damascene process and a beam-then-anchor process. In one embodiment, stress inverter member 206, resonating member 204 and anchors 208 are formed by using a process wherein all fabrication process steps are carried out at a temperature less than approximately 450° C.

Substrate 202 may be comprised of any material suitable for MEMS fabrication processes and to provide structural integrity for MEMS structure 200. In an embodiment, substrate 202 is comprised of group IV-based materials such as crystalline silicon, germanium or silicon-germanium. In another embodiment, substrate 202 is comprised of a III-V material. Substrate 202 may also comprise an insulator layer. In one embodiment, the insulator layer is comprised of a material selected from the group consisting of silicon dioxide, silicon nitride, silicon oxy-nitride and a high-k dielectric layer. Substrate 202 may itself be an insulator. In one embodiment, substrate 202 substantially comprises a material selected from the group consisting of glass, quartz and sapphire. Substrate 202 may comprise a fabricated integrated circuit formed therein. For example, in accordance with an embodiment of the present invention, substrate 202 comprises an insulator layer above a plurality of interconnect structures which connect a plurality of micro-electronic devices, wherein MEMS structure 200 is fabricated above the insulator layer. In one embodiment, the plurality of micro-electronic devices is a plurality of N-type and P-type transistors and the plurality of interconnect structures is a plurality of metal interconnects that tie the plurality of N-type and P-type transistors into an integrated circuit.

Substrate 202 may have an effective TCE different from the TCE of MEMS structure 200 and, hence, different from stress inverter member 206, resonating member 204 and anchors 208. In one embodiment, the effective TCE of substrate 202 is less than the TCE of MEMS structure 200. The effective TCE is dictated approximately by the TCE of the dominant portion of substrate 202. For example, in an embodiment, substrate 202 comprises an integrated circuit formed on a bulk single-crystal silicon substrate and the effective TCE of substrate 202 is substantially the same as the TCE for mono-crystalline silicon. In a specific embodiment, stress inverter member 206, resonating member 204 and anchors 208 are all comprised of silicon-germanium and have a TCE greater than the TCE of substrate 202.

In the embodiment depicted in FIG. 2, the resonator is driven and sensed electrostatically by the adjacent pair of electrodes 210. However, any means suitable to sustain the resonator's motion may be used, such as thermal, piezoelectric, piezoresistive or optical means. The pair of electrodes 210 may comprise any material suitable to act as a drive and/or sense electrode for resonating member 204 and suitable for MEMS fabrication. For example, in accordance with an embodiment of the present invention, the pair of electrodes 210 is comprised of a material selected from the group consisting of a semiconductor material heavily doped with charge-carrier impurity atoms and a conductor. In one embodiment, the pair of electrodes 210 is comprised of a heavily doped semiconductor material and is selected from the group consisting of silicon, germanium, silicon-germanium, carbon-doped silicon, carbon-doped silicon-germanium and a III-V material. In a specific embodiment, the pair of electrodes 210 is comprised of a group IV material and is heavily doped with charge-carrier impurity atoms selected from the group consisting of boron, indium, phosphorus, arsenic and antimony. In an embodiment, the pair of electrodes 210 is comprised of substantially the same material as stress inverter member 206, resonating member 204 and anchors 208.

Figure 3A:
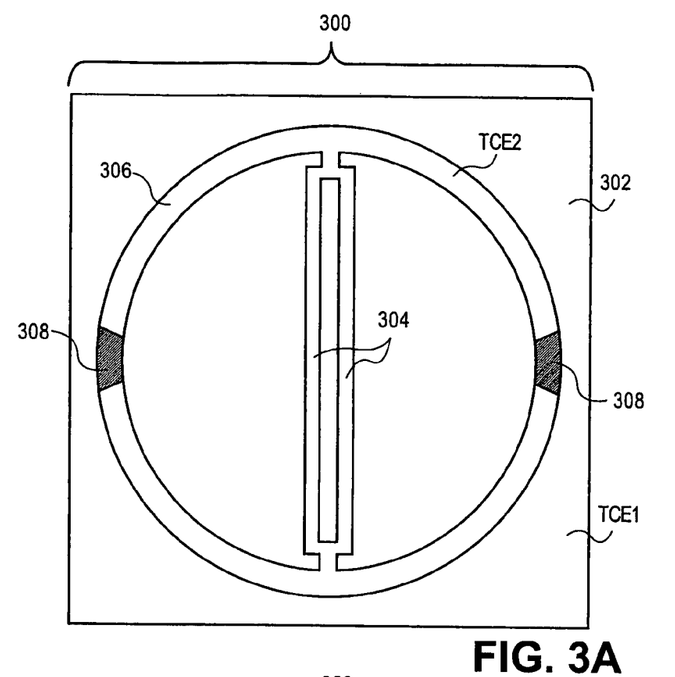
FIGS. 3A-B illustrate top-down views representing a MEMS structure having a stress inverter temperature-compensated resonating member responding to an increase in temperature, in accordance with an embodiment of the present invention.
Figure 3B:
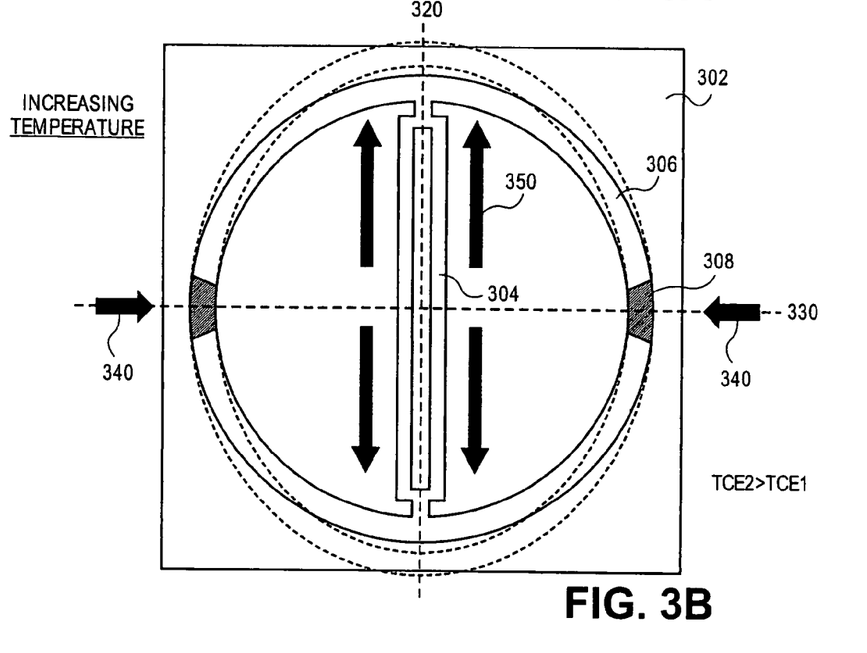

A stress inverter member may be used to compensate for the TCf of a resonating member in a MEMS structure. FIGS. 3A-B illustrate top-down views representing a MEMS structure having a stress inverter temperature-compensated resonating member responding to an increase in temperature, in accordance with an embodiment of the present invention.

Referring to FIG. 3A, a MEMS structure 300 is formed on a substrate 302. MEMS structure 300 is comprised of a resonating member 304 suspended above substrate 302 and housed in a stress inverter member 306. Stress inverter member 306 is coupled with substrate 302 via anchors 308. For convenience, drive and/or sense electrodes are not depicted. In accordance with an embodiment of the present invention, the TCE of stress inverter member 306 (i.e. TCE2) is greater than the TCE of substrate 302 (i.e. TCE1). In a particular embodiment, stress inverter member 306, resonating member 304 and anchors 308 are comprised substantially of polycrystalline silicon-germanium and substrate 302 is comprised substantially of mono-crystalline silicon.

Referring to FIG. 3B, stress inverter member 306 anchored to substrate 302 at anchors 308 responds to an increasing temperature by deforming in shape, as depicted by the dashed oval shape. That is, the shape and positioning of a region of stress inverter member 306 is altered to accommodate the stress induced on a different region of stress inverter member 306. For example, in accordance with an embodiment of the present invention, stress inverter member 306 is anchored to substrate 302 via anchors 308 at two opposing points which form axis 330. As depicted by arrows 340, the TCE mismatch (TCE2>TCE1) results in a compressive stress induced on stress inverter member 306 in response to an increase in temperature. That is, substrate 302 effectively constrains the expansion of stress inverter 306.

The compressive stress induced along axis 330 deforms stress inverter member 306 along axis 320, wherein axis 320 is orthogonal to axis 330. This deformation of stress inverter member 306 induces a tensile stress on resonating member 304, as depicted by arrows 350. Thus, stress inverter member 306 inverts the compressive stress (i.e. the stress that would otherwise be experienced by a non-compensated resonating member) to a tensile stress induced on resonating member 304. In a specific embodiment, axis 320 is formed parallel to the longest dimension of resonating member 304 in order to maximize the tensile stress induced on resonating member 304, as depicted in FIG. 3B.

Stress inverter member 306 may be used to compensate a resonating member having a non-zero TCf. In accordance with an embodiment of the present invention, resonating member 304 has a negative TCf. In a specific embodiment, residual stress from the fabrication of resonating member 304 at above room-temperature process conditions increases the magnitude of the negative TCf. Thus, the resonance frequency of resonating member 304 decreases in response to an increase in temperature. In one embodiment, the tensile stress induced by stress inverter member 306 on resonating member 304 acts to counter this otherwise decreasing resonance frequency in response to an increase in temperature. Thus, a temperature-compensated resonating member may be formed.

Figure 4A:
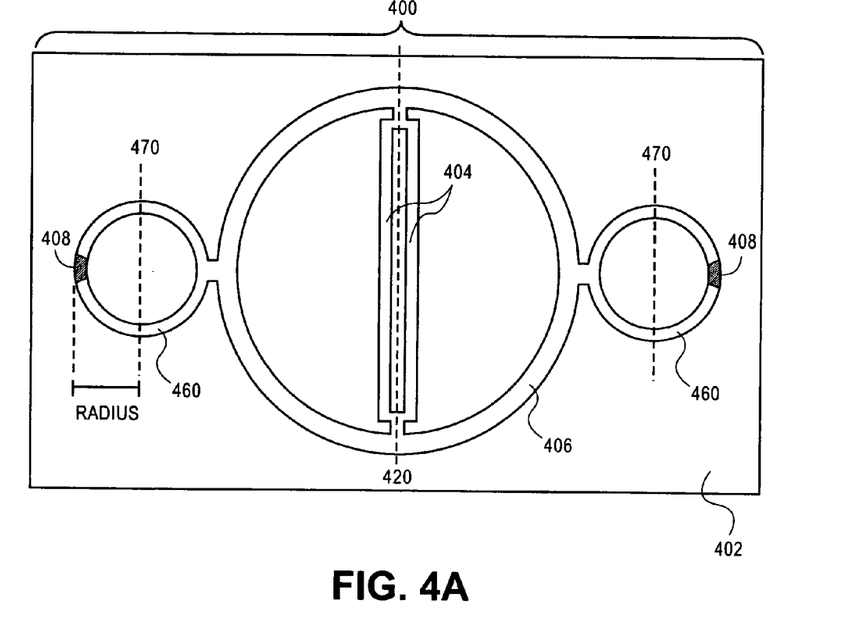
FIGS. 4A-B illustrate a top-down view representing a MEMS structure having a partially decoupled stress inverter structure which contains a resonating member and a related correlation plot of frequency variation as a function of temperature, in accordance with an embodiment of the present invention.
Figure 4B:
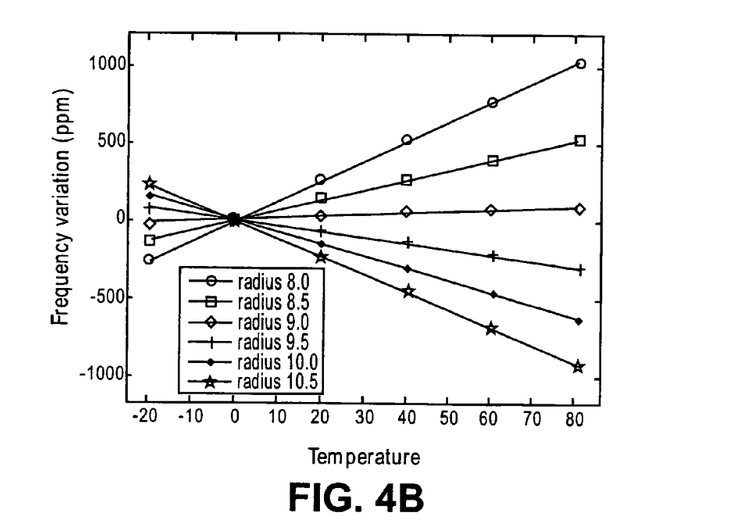

It may be the case that a stress inverter member over compensates for the TCf of a resonating member. In such a case, the stress inverter may need to be partially decoupled from the substrate, in order to achieve the desired magnitude of induced stress on the resonating member. FIGS. 4A-B illustrate a top-down view representing a MEMS structure having a partially decoupled stress inverter structure which contains a resonating member and a related correlation plot of frequency variation as a function of temperature, in accordance with an embodiment of the present invention.

Referring to FIG. 4A, a MEMS structure 400 is formed on a substrate 402. MEMS structure 400 is comprised of a resonating member 404 suspended above substrate 402 and housed in a stress inverter member 406. A pair of decoupling members 460 is connected to either side of stress inverter member 406. The pair of decoupling members 460 is coupled with substrate 402 via anchors 408. For convenience, drive and/or sense electrodes are not depicted. In accordance with an embodiment of the present invention, the TCE of MEMS structure 400 is greater than the TCE of substrate 402. In a particular embodiment, stress inverter member 406, the pair of decoupling members 460, resonating member 404 and anchors 408 are comprised substantially of polycrystalline silicon-germanium and substrate 402 is comprised substantially of mono-crystalline silicon.

The pair of decoupling members 460 may be any feature suitable to decouple a portion of the stress induced by stress inverter member 406 on resonating member 404 in response to a change in temperature. Thus, in accordance with an embodiment of the present invention, the pair of decoupling members 460 is provided for reducing the magnitude of tensile stress induced on resonating member 404. In one embodiment, the pair of decoupling members 460 is a pair of rings, as depicted in FIG. 4A. The pair of decoupling members 460 may reduce the magnitude of the inverted stress induced by stress inverter member 406 on resonating member 404, in response to a changing temperature, by deforming along axes 470. That is, the deformation of the pair of decoupling members 460 reduces the extent of deformation of stress inverter member 406 along axis 420, thereby reducing the magnitude of the stress induced on resonating member 404.

Referring to FIG. 4B, the extent of reduction of inverted stress by the pair of decoupling members 460 is fine-tuned by altering the radius of the pair of decoupling members 460. FIG. 4B is a correlation plot of frequency variation of a stress inverter temperature-compensated resonating member as a function of temperature. In this example, the beam length of each of the beams of resonating member 404 is fixed at approximately 75 microns, the beam width is fixed at approximately 1.5 microns and the beam thickness is fixed at approximately 2 microns. For these dimensions, the anti-symmetric mode (the $11^{th}$ mode) of resonating member 404 has a frequency of approximately 1.51 MHz. The width of stress inverter member 406 is fixed at approximately 5 microns. The pair of decoupling members 460 is a pair of rings, each with a fixed width of approximately 1.5 microns. By varying the radius of each of the rings of the pair of decoupling members 460, the TCf of resonating member 404 may be adjusted to a desired value. Under the above conditions, the TCf of resonating member 404 varies from −12.7 ppm/° C. at a decoupling ring radius of 8 microns to +11.8 ppm/° C. at a decoupling ring radius of 10.5 microns, as depicted in FIG. 4B. Furthermore, under the above conditions, the TCf of resonating member 404 is approximately −1 ppm/° C. at a decoupling ring radius of 9 microns. Thus, in accordance with an embodiment of the present invention, stress inverter member 406 as fine-tuned with the pair of decoupling members 460 substantially compensates, i.e. cancels out, the otherwise negative TCf of resonating member 404.

Figure 5A:
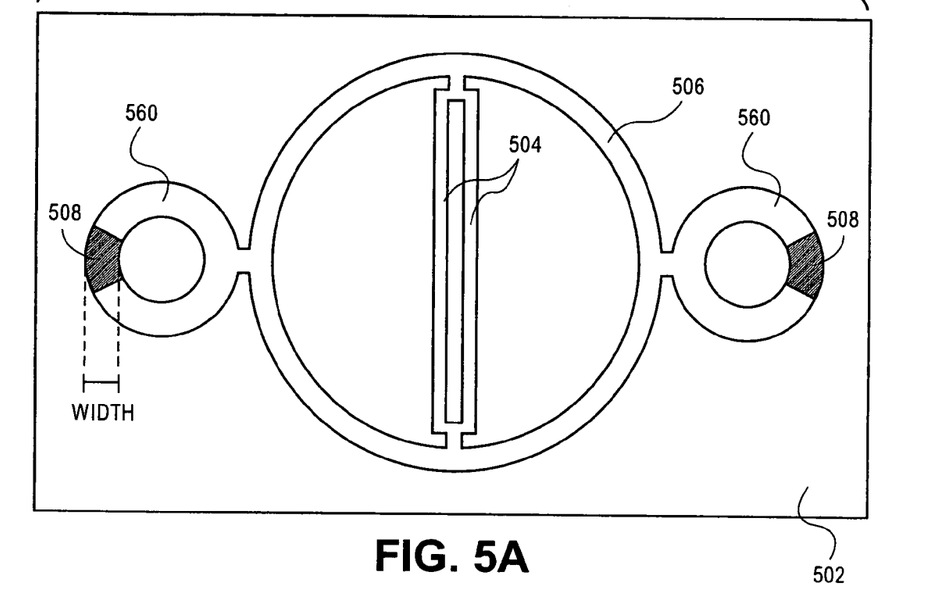
FIGS. 5A-B illustrate a top-down view representing a MEMS structure having a stress inverter temperature-compensated resonating member and a related correlation plot of frequency variation as a function of temperature, in accordance with an embodiment of the present invention.
Figure 5B:
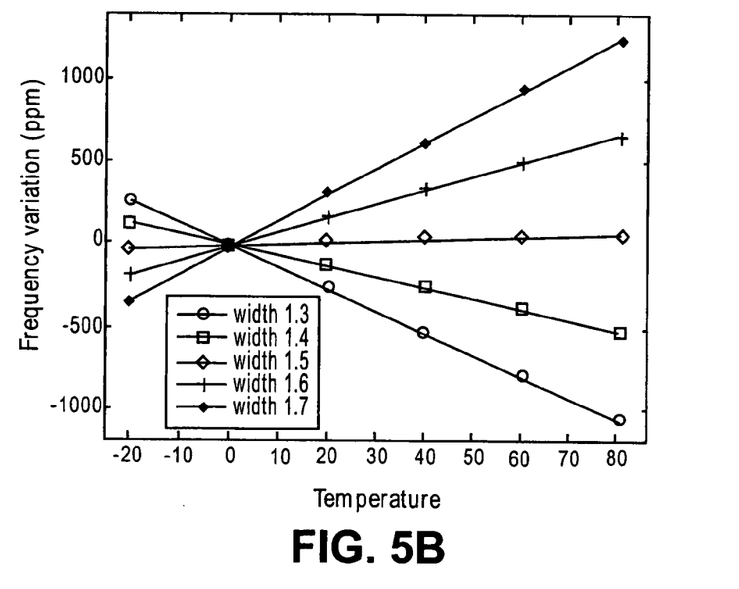

The magnitude of inverted stress induced on a resonating member may also be fine-tuned by varying the width of a pair of decoupling members. FIGS. 5A-B illustrate a top-down view representing a MEMS structure having a stress inverter temperature-compensated resonating member and a related correlation plot of frequency variation as a function of temperature, in accordance with an embodiment of the present invention.

Referring to FIG. 5A, a MEMS structure 500 is formed on a substrate 502. MEMS structure 500 is comprised of a resonating member 504 suspended above substrate 502 and housed in a stress inverter member 506. A pair of decoupling members 560 is connected to either side of stress inverter member 506. The pair of decoupling members 560 is coupled with substrate 502 via anchors 508. For convenience, drive and/or sense electrodes are not depicted. The TCE of MEMS structure 500 is greater than the TCE of substrate 502. In a particular embodiment, stress inverter member 506, the pair of decoupling members 560, resonating member 504 and anchors 508 are comprised substantially of polycrystalline silicon-germanium and substrate 502 is comprised substantially of mono-crystalline silicon.

Referring to FIG. 5B, the extent of reduction of inverted stress by the pair of decoupling members 560 is fine-tuned by altering the width of the pair of decoupling members 560. FIG. 5B is a correlation plot of frequency variation of a stress inverter temperature-compensated resonating member as a function of temperature. In this example, the beam dimensions for resonating member 504 are the same as those described for the beam dimensions of resonating member 404 from FIG. 4. The width of stress inverter member 506 is also fixed at approximately 5 microns. The pair of decoupling members 560 is a pair of rings, each with a fixed radius of approximately 9 microns. By varying the width of each of the rings of the pair of decoupling members 560, the TCf of resonating member 504 may be adjusted to a desired value. Under the above conditions, the TCf of resonating member 504 varies from a negative value at a decoupling ring width of 1.3 microns to a positive value at a decoupling ring width of 1.7 microns, as depicted in FIG. 4B. Thus, in accordance with an embodiment of the present invention, stress inverter member 506 is fine-tuned, with the pair of decoupling members 560 adjusting the TCf of resonating member 504.

Figure 6A:
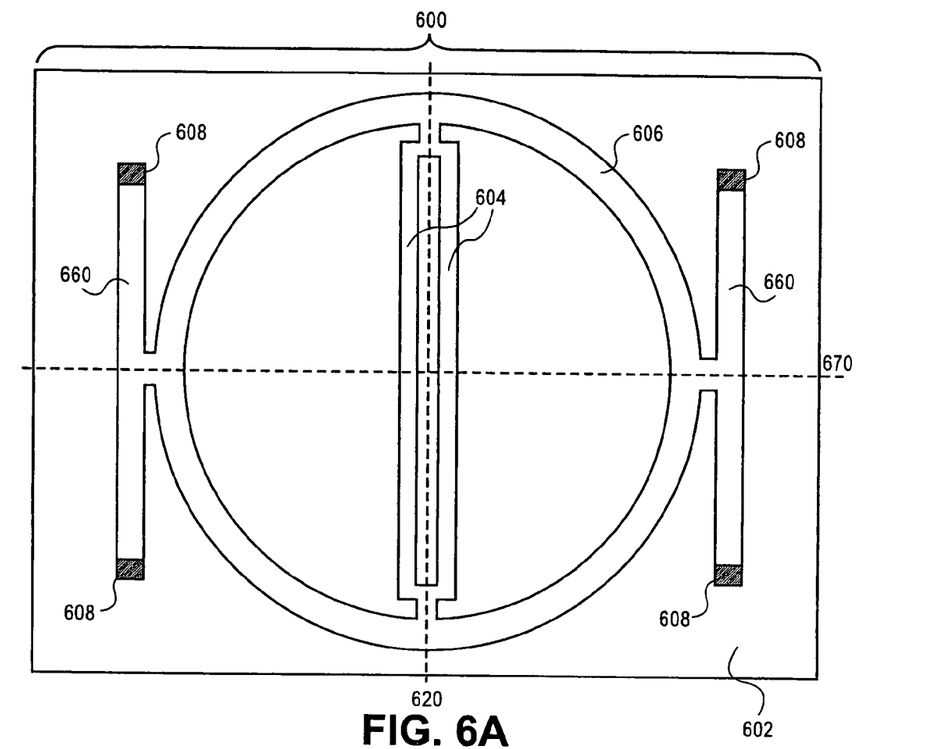
FIGS. 6A-B illustrate a top-down view representing a MEMS structure having a stress inverter temperature-compensated resonating member and a related correlation plot of frequency variation as a function of temperature, in accordance with an embodiment of the present invention.
Figure 6B:
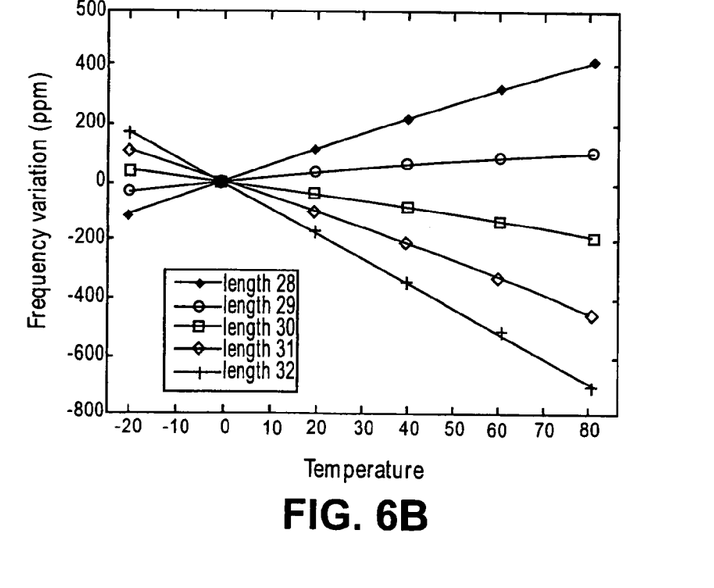

The magnitude of inverted stress induced on a resonating member may also be fine-tuned by a pair of decoupling beams. FIGS. 6A-B illustrate a top-down view representing a MEMS structure having a stress inverter temperature-compensated resonating member and a related correlation plot of frequency variation as a function of temperature, in accordance with an embodiment of the present invention.

Referring to FIG. 6A, a MEMS structure 600 is formed on a substrate 602. MEMS structure 600 is comprised of a resonating member 604 suspended above substrate 602 and housed in a stress inverter member 606. A pair of decoupling members 660 is connected to either side of stress inverter member 606. The pair of decoupling members 660 is coupled with substrate 602 via anchors 608. For convenience, drive and/or sense electrodes are not depicted. The TCE of MEMS structure 600 is greater than the TCE of substrate 602. In a particular embodiment, stress inverter member 606, the pair of decoupling members 660, resonating member 604 and anchors 608 are comprised substantially of polycrystalline silicon-germanium and substrate 602 is comprised substantially of mono-crystalline silicon.

The pair of decoupling members 660 may be any feature suitable to decouple a portion of the stress induced by stress inverter member 606 on resonating member 604 in response to a change in temperature. Thus, in accordance with an embodiment of the present invention, the pair of decoupling members 660 is provided for reducing the magnitude of tensile stress induced on resonating member 604. In one embodiment, the pair of decoupling members 660 is a pair of beams, as depicted in FIG. 6A. The pair of decoupling members 660 may reduce the magnitude of the inverted stress induced by stress inverter member 606 on resonating member 404 in response to a changing temperature by deforming along axis 670. That is, the deformation of the pair of decoupling members 660 reduces the extent of deformation of stress inverter member 606 along axis 620, reducing the magnitude of the stress induced on resonating member 604. Thus, in accordance with an embodiment of the present invention, the pair of decoupling beams 660 act as a pair of linear springs. When subjected to a point load in the center, each beam has a linear spring constant $k_{linear}=192\ EI/L^3$, where $I=w^3h/12$ (L is the length, w is the width and h is the thickness of the beam). That is, the variable w refers to the dimension of the spring 660 in the direction of axis 670, while the variable h refers to its thickness in the direction perpendicular to substrate 602.

Referring to FIG. 6B, the extent of reduction of inverted stress by the pair of decoupling members 660 is fine-tuned by altering the length of the pair of decoupling members 660. FIG. 6B is a correlation plot of frequency variation of a stress inverter temperature-compensated resonating member as a function of temperature. In this example, the beam dimensions for resonating member 604 are the same as those described for the beam dimensions of resonating member 404 from FIG. 4. The width of stress inverter member 606 is also fixed at approximately 5 microns. The pair of decoupling members 660 is a pair of beams, each with a fixed width of approximately 1.5 microns. By varying the length of each of the beams of the pair of decoupling members 660, the TCf of resonating member 604 may be adjusted to a desired value. Under the above conditions, the TCf of resonating member 604 varies from a negative value at a decoupling beam length of 32 microns to a positive value at a decoupling beam length of 28 microns, as depicted in FIG. 6B. Thus, in accordance with an embodiment of the present invention, stress inverter member 606 is fine-tuned, with the pair of decoupling members 660 adjusting the TCf of resonating member 604.

Figure 7:
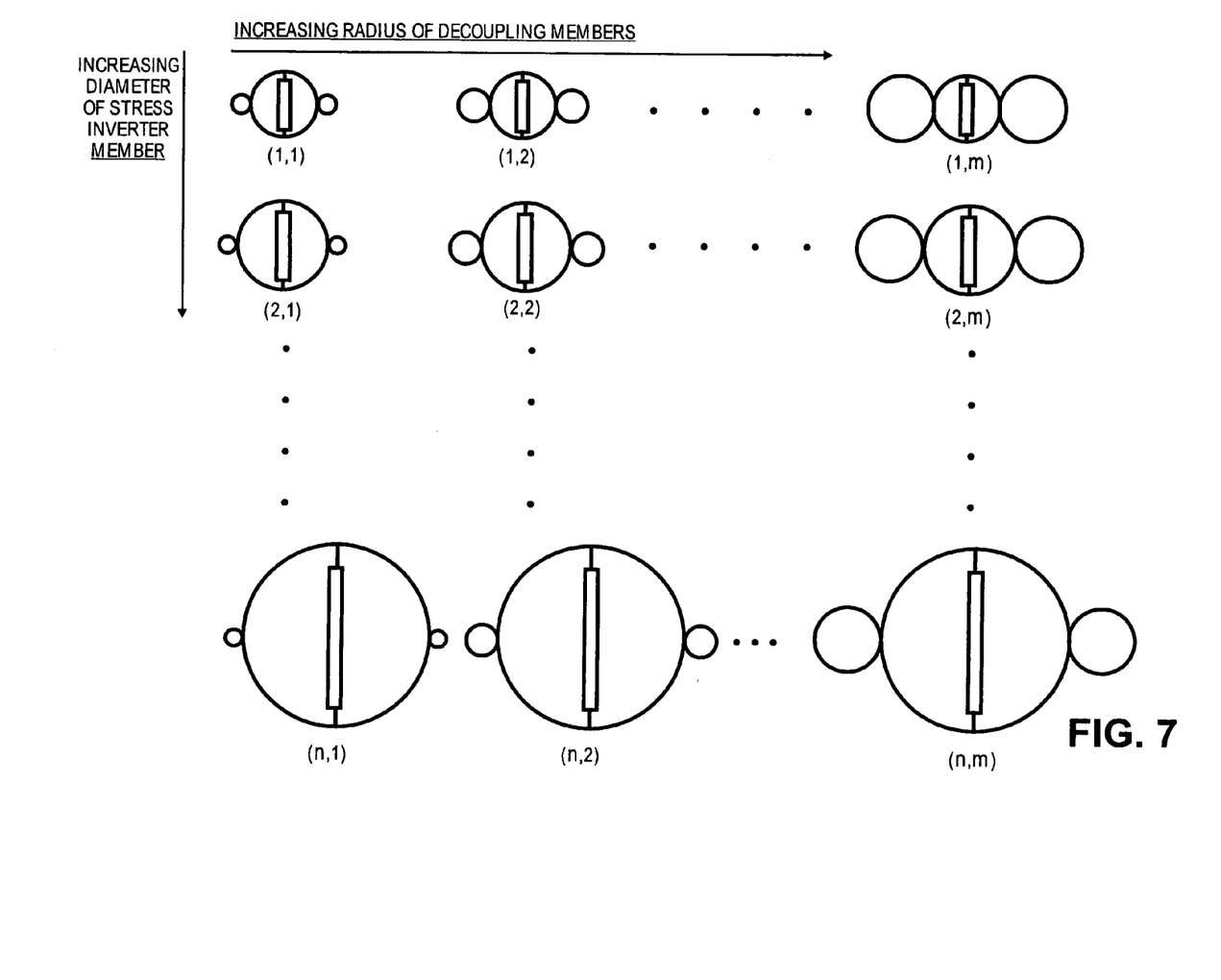
FIG. 7 illustrates a top-down view representing an n by m array of MEMS structures having stress inverter temperature-compensated resonating members, in accordance with an embodiment of the present invention.

A MEMS structure may comprise an array of resonating members housed in stress inverter members. FIG. 7 illustrates a top-down view representing an n by m array of MEMS structures having stress inverter temperature-compensated resonating members, in accordance with an embodiment of the present invention.

Referring to FIG. 7, an array of MEMS resonators comprises n rows and m columns of stress inverter members suspended above a substrate. Each stress inverter member houses a resonating member and is connected to a pair of decoupling members coupled with the substrate. Each row of the array of MEMS resonators may have nominally identical room-temperature frequencies and systematically varying TCfs. Thus, in accordance with an embodiment of the present invention, the diameter of each stress inverter member is the same within each row of stress inverter members but increases for each successive row of stress inverter members. Furthermore, each pair of decoupling members is a pair of rings, wherein the radius of each pair of rings is the same within each column of stress inverter members but increases for each successive column of stress inverter members, as depicted in FIG. 7. That is, the resonance frequency of each MEMS resonator in the array decreases from top to bottom, while the TCf decreases from left to right. In an alternative embodiment, each pair of decoupling members is a pair of beams, wherein the length of each pair of beams is the same within each column of stress inverter members but increases for each successive column of stress inverter members.

Thus, an array of MEMS resonators with systematically varying TCfs may be formed. In accordance with an embodiment of the present invention, using a MEMS structure comprising an array of MEMS resonators ensures that a device having such an array will always comprise a MEMS resonator with a target frequency and TCf. In another embodiment, a MEMS structure comprising an array of MEMS resonators is used for the temperature calibration of sensors and other electronic systems. In a specific embodiment, a sparse array of MEMS resonators is used, i.e. not every point (n,m) of the array has a dedicated MEMS resonator.

Figure 8A:
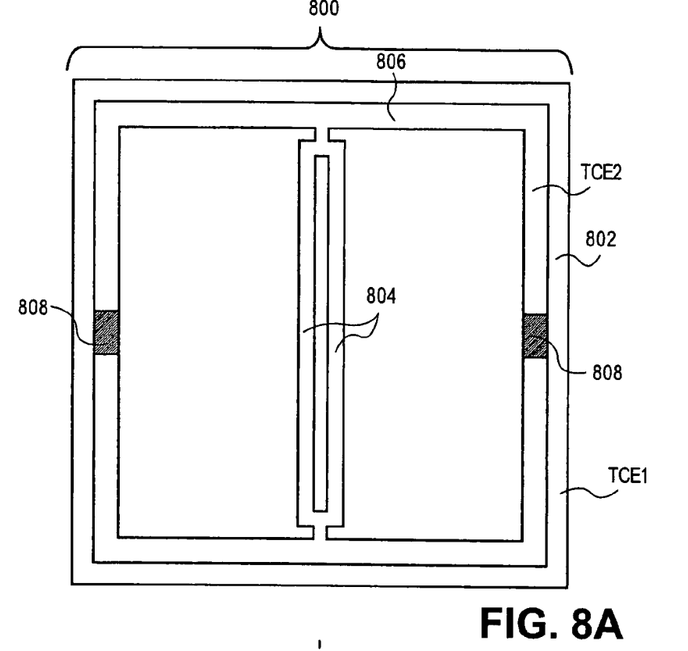
FIGS. 8A-B illustrate top-down views representing a MEMS structure having a stress inverter temperature-compensated resonating member responding to an increase in temperature, in accordance with an embodiment of the present invention.
Figure 8B:
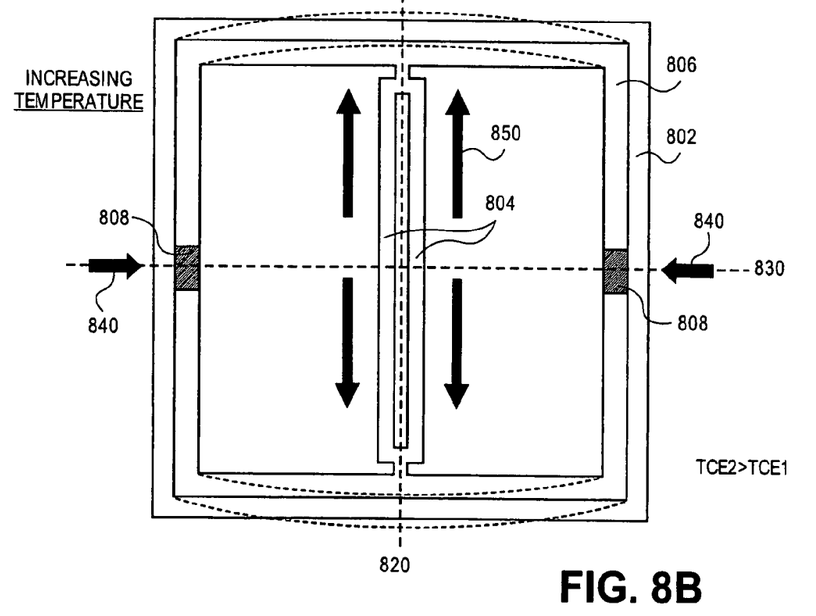

The shape of a stress inverter member is not limited to that of a ring. In an alternative embodiment, a stress inverter has the shape of a square frame. FIGS. 8A-B illustrate top-down views representing a MEMS structure having a stress inverter temperature-compensated resonating member responding to an increase in temperature, in accordance with an embodiment of the present invention.

Referring to FIG. 8A, a MEMS structure 800 is formed on a substrate 802. MEMS structure 800 is comprised of a resonating member 804 suspended above substrate 802 and housed in a stress inverter member 806. Stress inverter member 806 is coupled with substrate 802 via anchors 808. For convenience, drive and/or sense electrodes are not depicted. In accordance with an embodiment of the present invention, the TCE of stress inverter member 806 (i.e. TCE2) is greater than the TCE of substrate 802 (i.e. TCE1). In a particular embodiment, stress inverter member 806, resonating member 804 and anchors 808 are comprised substantially of polycrystalline silicon-germanium and substrate 802 is comprised substantially of mono-crystalline silicon.

Referring to FIG. 8B, stress inverter member 806 having a square frame shape responds to an increasing temperature by deforming in shape, as depicted by the dashed bent shape. That is, the shape and positioning of a region of stress inverter member 806 is altered to accommodate the stress induced on a different region of stress inverter member 806. For example, in accordance with an embodiment of the present invention, stress inverter member 806 is anchored to substrate 802 via anchors 808 at two opposing points which form axis 830. As depicted by arrows 840, the TCE mismatch (TCE2>TCE1) results in a compressive stress induced on stress inverter member 806 in response to an increase in temperature. That is, substrate 802 effectively constrains the expansion of stress inverter 806.

The compressive stress induced along axis 830 deforms stress inverter member 806 along axis 820, wherein axis 820 is orthogonal to axis 830. This deformation of stress inverter member 806 induces a tensile stress on resonating member 804, as depicted by arrows 850. Thus, stress inverter member 806 inverts the compressive stress (i.e. the stress that would otherwise be experienced by a non-compensated resonating member) to a tensile stress induced on resonating member 804. In a specific embodiment, axis 820 is formed parallel to the longest dimension of resonating member 804 in order to maximize the tensile stress induced on resonating member 804, as depicted in FIG. 8B.

Stress inverter member 806 having a square frame shape may be used to compensate a resonating member 804 having a negative TCf. In a specific embodiment, residual stress from the fabrication of resonating member 804 at above room-temperature process conditions increases the magnitude of the negative TCf. Thus, the resonance frequency of resonating member 804 decreases in response to an increase in temperature. In one embodiment, the tensile stress induced by stress inverter member 806 on resonating member 804 acts to counter this otherwise decreasing resonance frequency in response to an increase in temperature. Thus, a temperature-compensated resonating member housed in a square frame-shaped stress inverter member may be formed. In a specific embodiment, a MEMS structure having a square frame-shaped stress inverter member also incorporates a pair of decoupling members to decouple a portion of the stress induced by the stress inverter member on a resonating member in response to a change in temperature.

Figure 9A:
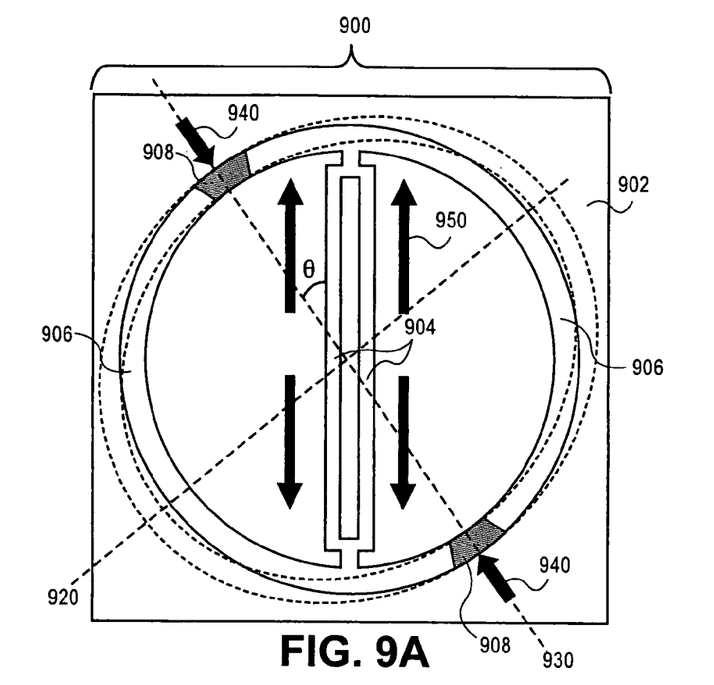
FIGS. 9A-B illustrate top-down views representing MEMS structures having stress inverter temperature-compensated resonating members, in accordance with an embodiment of the present invention.
Figure 9B:
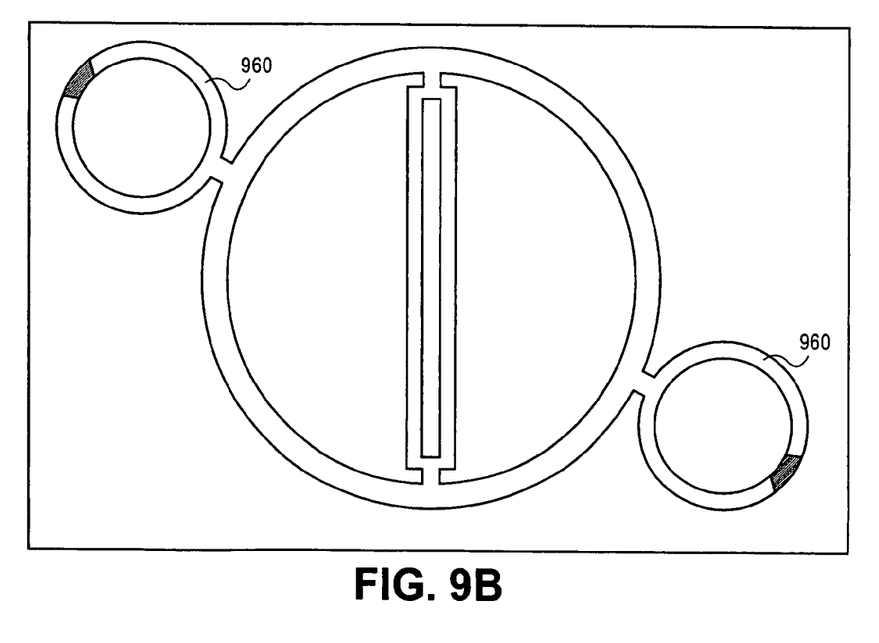

The axis of deformation of a stress inverter member need not be aligned in parallel with the longest dimension of a resonating member. FIGS. 9A-B illustrate top-down views representing MEMS structures having stress inverter temperature-compensated resonating members, in accordance with an embodiment of the present invention.

Referring to FIG. 9A, a MEMS structure 900 is formed on a substrate 902. MEMS structure 900 is comprised of a resonating member 904 suspended above substrate 902 and housed in a stress inverter member 906. Stress inverter member 906 is coupled with substrate 902 via anchors 908. For convenience, drive and/or sense electrodes are not depicted. In accordance with an embodiment of the present invention, the TCE of stress inverter member 906 is greater than the TCE of substrate 902. In a particular embodiment, stress inverter member 906, resonating member 904 and anchors 908 are comprised substantially of polycrystalline silicon-germanium and substrate 902 is comprised substantially of monocrystalline silicon.

Referring again to FIG. 9A, stress inverter member 906 responds to an increasing temperature by deforming in shape, as depicted by the dashed oval shape. That is, the shape and positioning of a region of stress inverter member 906 is altered to accommodate the stress induced on a different region of stress inverter member 906. For example, in accordance with an embodiment of the present invention, stress inverter member 906 is anchored to substrate 902 via anchors 908 at two opposing points which form axis 930. As depicted by arrows 940, the TCE mismatch results in a compressive stress induced on stress inverter member 906 in response to an increase in temperature. That is, substrate 902 effectively constrains the expansion of stress inverter 906.

The compressive stress induced along axis 930 deforms stress inverter member 906 along axis 920, wherein axis 920 is orthogonal to axis 930. This deformation of stress inverter member 906 induces a tensile stress on resonating member 904, as depicted by arrows 950. Thus, stress inverter member 906 inverts the compressive stress (i.e. the stress that would otherwise be experienced by a non-compensated resonating member) to a tensile stress induced on resonating member 904. In one embodiment, axis 920 is aligned with an angle θ relative to the longest dimension of resonating member 904, wherein 0°<θ<90°, as depicted in FIG. 9A. That is, in accordance with an embodiment of the present invention, the direction of the deformation of a stress inverter member is aligned skewed to the longest dimension of a resonating member in order to select the desired magnitude of the tensile stress induced on the resonating member. In a specific embodiment, a MEMS structure having a skewed stress inverter member also incorporates a pair of decoupling members 960 to decouple a portion of the stress induced by the stress inverter member on a resonating member in response to a change in temperature, as depicted in FIG. 9B.

Figure 10A:
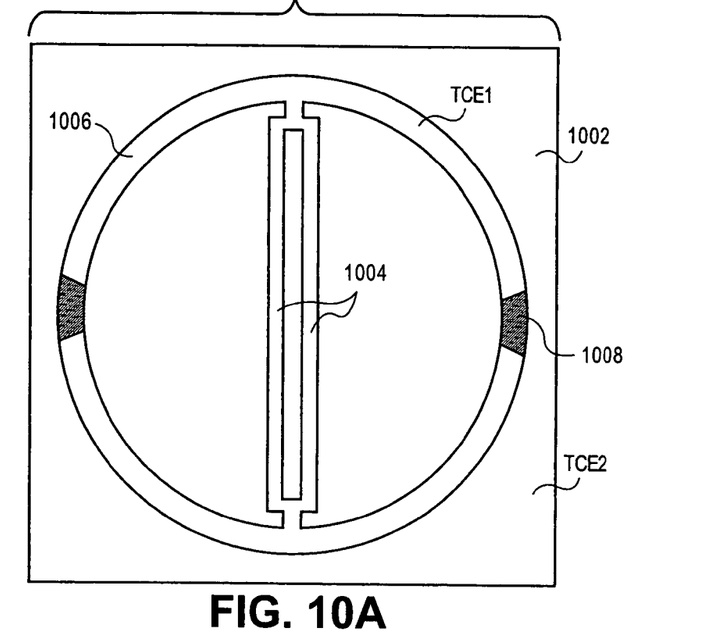
FIGS. 10A-B illustrate top-down views representing a MEMS structure having a stress inverter temperature-compensated resonating member responding to an increase in temperature, in accordance with an embodiment of the present invention.
Figure 10B:
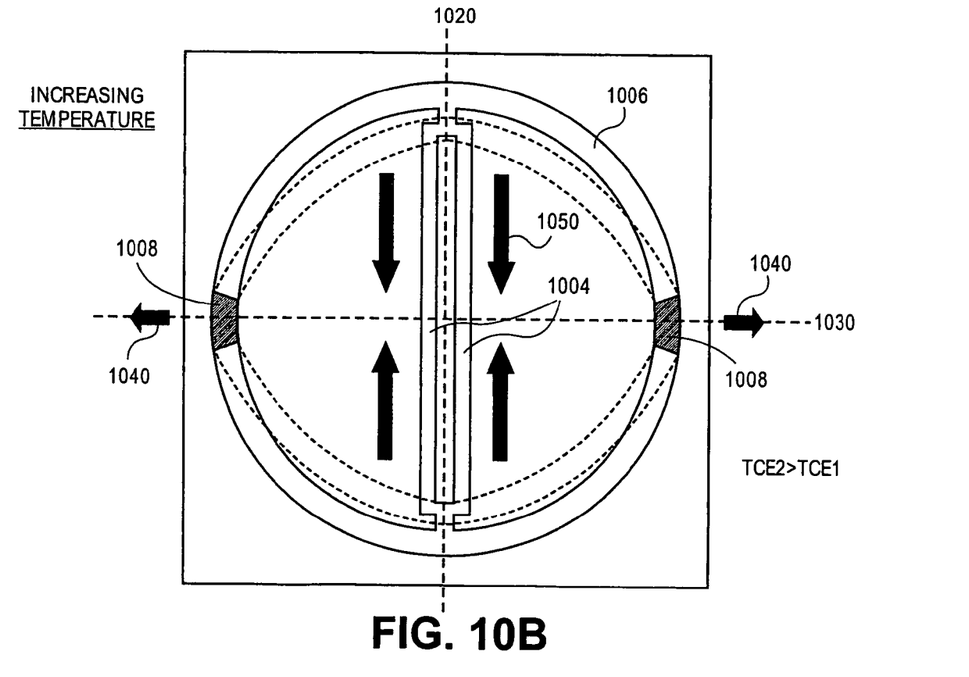

A stress inverter member may also be used to compensate for a positive TCf of a resonating member in a MEMS structure. FIGS. 10A-B illustrate top-down views representing a MEMS structure having a stress inverter temperature-compensated resonating member responding to an increase in temperature, in accordance with an embodiment of the present invention.

Referring to FIG. 10A, a MEMS structure 1000 is formed on a substrate 1002. MEMS structure 1000 is comprised of a resonating member 1004 suspended above substrate 1002 and housed in a stress inverter member 1006. Stress inverter member 1006 is coupled with substrate 1002 via anchors 1008. For convenience, drive and/or sense electrodes are not depicted. In accordance with an embodiment of the present invention, the TCE of stress inverter member 1006 (i.e. TCE1) is less than the TCE of substrate 1002 (i.e. TCE2). In a particular embodiment, stress inverter member 1006, resonating member 1004 and anchors 1008 are comprised substantially of diamond and substrate 1002 is comprised substantially of amorphous silicon dioxide.

Referring to FIG. 10B, stress inverter member 1006 responds to an increasing temperature by deforming in shape, as depicted by the dashed oval shape. That is, the shape and positioning of a region of stress inverter member 1006 is altered to accommodate the stress induced on a different region of stress inverter member 1006. For example, in accordance with an embodiment of the present invention, stress inverter member 1006 is anchored to substrate 1002 via anchors 1008 at two opposing points which form axis 1030. As depicted by arrows 1040, the TCE mismatch (TCE2>TCE1) results in a tensile stress induced on stress inverter member 1006 in response to an increase in temperature. That is, substrate 1002 effectively forces the expansion of stress inverter 1006.

The tensile stress induced along axis 1030 deforms stress inverter member 1006 along axis 1020, wherein axis 1020 is orthogonal to axis 1030. This deformation of stress inverter member 1006 induces a compressive stress on resonating member 1004, as depicted by arrows 1050. Thus, stress inverter member 1006 inverts the tensile stress (i.e. the stress that would otherwise be experienced by a non-compensated resonating member) to a compressive stress induced on resonating member 1004. In a specific embodiment, axis 1020 is formed parallel to the longest dimension of resonating member 1004 in order to maximize the compressive stress induced on resonating member 1004, as depicted in FIG. 10B. In an alternative embodiment, the direction of the deformation of the stress inverter member is aligned skewed to the longest dimension of the resonating member in order to select the desired magnitude of the compressive stress induced on the resonating member. In a particular embodiment, the MEMS structure also incorporates a pair of decoupling members to decouple a portion of the compressive stress induced by the stress inverter member on the resonating member in response to a change in temperature.

Stress inverter member 1006 may be used to compensate a resonating member having a positive TCf. Thus, in accordance with an embodiment of the present invention, the resonance frequency of resonating member 1004 increases in response to an increase in temperature. In one embodiment, the compressive stress induced by stress inverter member 1006 on resonating member 1004 acts to counter this otherwise increasing resonance frequency in response to an increase in temperature. Thus, a temperature-compensated resonating member may be formed.

Thus, a MEMS structure having a temperature-compensated resonating member has been disclosed. In an embodiment, the MEMS structure comprises a stress inverter member coupled with a substrate. A resonating member is housed in the stress inverter member and is suspended above the substrate. In one embodiment, the MEMS stress inverter member is used to alter the TCf of the resonating member by inducing a stress on the resonating member in response to a change in temperature. In another embodiment, the stress inverter member is coupled with the substrate via a pair of decoupling members. In one embodiment, the pair of decoupling members is provided to reduce the magnitude of the stress induced on the resonating member. In a specific embodiment, an array of n rows and m columns of stress inverter members is provided. Each stress inverter member houses a resonating member suspended above a substrate and is connected to a pair of decoupling members coupled with the substrate.

What is claimed is:

1. A MEMS structure, comprising:
    a stress inverter member coupled with a substrate; and
    a resonating member housed in said stress inverter member and suspended above said substrate.

2. The MEMS structure of claim 1 wherein the TCE of said stress inverter member is greater than the TCE of said substrate.

3. The MEMS structure of claim 2 wherein said stress inverter member is comprised substantially of silicon-germanium and said substrate is comprised substantially of silicon.

4. The MEMS structure of claim 1 wherein the thermal coefficient of frequency of said resonating member is negative and wherein said stress inverter member is for inducing a tensile stress on said resonating member in response to an increase in temperature.

5. The MEMS structure of claim 4 wherein said stress inverter member and said resonating member are comprised substantially of silicon-germanium, and wherein said substrate is comprised substantially of silicon.

6. The MEMS structure of claim 1 wherein the shape of said stress inverter member is selected from the group consisting of a ring and a square frame.

7. The MEMS structure of claim 6 wherein said stress inverter member is coupled with said substrate by a pair of anchor points.

8. The MEMS structure of claim 7 wherein the axis formed by said pair of anchor points is orthogonal to the longest dimension of said resonating member.

9. The MEMS structure of claim 7 wherein the axis formed by said pair of anchor points has an angle $\theta$ relative to the longest dimension of said resonating member, where $0°<\theta<90°$.

10. The MEMS structure of claim 1, further comprising:
    a pair of electrodes coupled with said substrate on either side of said resonating member.

11. The MEMS structure of claim 10 wherein said pair of electrodes is comprised of substantially the same material as said resonating member.

12. The MEMS structure of claim 1 wherein the thermal coefficient of frequency of said resonating member is positive and wherein said stress inverter member is for inducing a compressive stress on said resonating member in response to an increase in temperature.

13. A MEMS structure, comprising:
    a stress inverter member suspended above a substrate;
    a pair of decoupling members connected to either side of said stress inverter member and coupled with said substrate; and
    a resonating member housed in said stress inverter member and suspended above said substrate.

14. The MEMS structure of claim 13 wherein the thermal coefficient of frequency of said resonating member is negative and wherein said stress inverter member is for inducing a tensile stress on said resonating member in response to an increase in temperature.

15. The MEMS structure of claim 14 wherein said pair of decoupling members is provided for reducing the magnitude of said tensile stress induced on said resonating member.

16. The MEMS structure of claim 15 wherein said pair of decoupling members is a pair of rings, and wherein the extent of reducing the magnitude of said tensile stress induced on said resonating member is determined by a parameter selected from the group consisting of the radius of each of said pair of rings and the width of each of said pair of rings.

17. The MEMS structure of claim 15 wherein said pair of decoupling members is a pair of beams, and wherein the extent of reducing the magnitude of said tensile stress induced on said resonating member is determined by the length of each of said pair of beams.

18. The MEMS structure of claim 13 wherein the TCE of said stress inverter member and said pair of decoupling members is greater than the TCE of said substrate.

19. The MEMS structure of claim 18 wherein said stress inverter member and said pair of decoupling members are comprised substantially of silicon-germanium and said substrate is comprised substantially of silicon.

20. The MEMS structure of claim 13 wherein said pair of decoupling members is coupled with said substrate by a pair of anchor points.

21. The MEMS structure of claim 20 wherein the axis formed by said pair of anchor points is orthogonal to the longest dimension of said resonating member.

22. The MEMS structure of claim 20 wherein the axis formed by said pair of anchor points has an angle $\theta$ relative to the longest dimension of said resonating member, where $0°<\theta<90°$.

23. A method for altering the thermal coefficient of frequency of a MEMS structure, comprising:
    providing a resonating member housed in a stress inverter member, wherein said stress inverter member is coupled with a substrate and said resonating member is suspended above said substrate; and
    inducing a stress on said resonating member with said stress inverter member in response to a change in temperature.

24. The method of claim 23 wherein inducing said stress reduces the magnitude of the thermal coefficient of frequency of said resonating member.

25. The method of claim 24 wherein inducing said stress on said resonating member comprises inducing a tensile stress on said resonating member in response to an increase in temperature.

26. The method of claim 24 wherein inducing said stress on said resonating member comprises inducing a compressive stress on said resonating member in response to an increase in temperature.

27. The method of claim 23 wherein said stress inverter member is coupled with said substrate via a pair of decoupling members.

28. The method of claim 27 wherein said pair of decoupling members is provided to reduce the magnitude of said stress induced on said resonating member.

29. The method of claim 23 wherein said resonating member and said stress inverter member are comprised substantially of silicon-germanium and said substrate is comprised substantially of silicon.

30. A MEMS structure, comprising:
an array of stress inverter members suspended above a substrate, wherein each stress inverter member houses a resonating member and is connected to a pair of decoupling members coupled with said substrate.

31. The MEMS structure of claim 30 wherein said array comprises n rows and m columns of stress inverter members suspended above said substrate.

32. The MEMS structure of claim 31 wherein the diameter of each stress inverter member is the same within each row of stress inverter members but increases for each successive row of stress inverter members.

33. The MEMS structure of claim 32 wherein each pair of decoupling members is a pair of rings, and wherein the radius of each pair of rings is the same within each column of stress inverter members but increases for each successive column of stress inverter members.

34. The MEMS structure of claim 32 wherein each pair of decoupling members is a pair of beams, and wherein the length of each pair of beams is the same within each column of stress inverter members but increases for each successive column of stress inverter members.

35. A MEMS structure, comprising:
a frame coupled with a substrate by a pair of anchor points, wherein the TCE of said frame is different from the TCE of said substrate;
a resonator member housed in said frame and suspended above said substrate, wherein said resonator member is, in one plane, completely surrounded by said frame; and
a pair of electrodes coupled with said substrate on either side of said resonator member.

36. The MEMS structure of claim 35, wherein said frame consists essentially of silicon-germanium and said substrate consists essentially of silicon.

37. The MEMS structure of claim 35, wherein the shape of said frame is selected from the group consisting of a ring and a square.

38. The MEMS structure of claim 35, wherein the axis formed by said pair of anchor points is orthogonal to the longest dimension of said resonator member.

39. The MEMS structure of claim 35, wherein the axis formed by said pair of anchor points has an angle $\theta$ relative to the longest dimension of said resonator member, where $0<\theta<90°$.

40. A method for altering the thermal coefficient of frequency of a MEMS structure, comprising:
providing a resonator member housed in a frame coupled with a substrate by a pair of anchor points, wherein said resonator member is suspended above said substrate, wherein the TCE of said frame is different from the TCE of said substrate, and wherein said resonator member is, in one plane, completely surrounded by said frame; and
applying a first stress to said frame, wherein, in response to applying said first stress, said frame applies a second, opposite, stress to said resonator member.

41. The method of claim 40, wherein applying said second stress reduces the magnitude of the thermal coefficient of frequency of said resonator member.

42. The method of claim 41, wherein said frame applies a tensile stress to said resonator member in response to an increase in temperature.

43. The method of claim 41, wherein said frame applies a compressive stress to said resonator member in response to a decrease in temperature.

44. The method of claim 41, wherein said frame applies a compressive stress to said resonator member in response to an increase in temperature.

45. The method of claim 41, wherein said frame applies a tensile stress to said resonator member in response to a decrease in temperature.

* * * * *